(12) United States Patent
Dangelmaier et al.

(10) Patent No.: US 11,024,565 B2
(45) Date of Patent: Jun. 1, 2021

(54) DIRECT SELECTIVE ADHESION PROMOTOR PLATING

(71) Applicant: Infineon Technologies AG, Neubiberg (DE)

(72) Inventors: Jochen Dangelmaier, Beratzhausen (DE); Kim Huat Hoa, Melaka (MY); Hazrul Alang Abd Hamid, Sembilan (MY); Andreas Allmeier, Pfatter (DE); Dietmar Lang, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 63 days.

(21) Appl. No.: 16/382,508

(22) Filed: Apr. 12, 2019

(65) Prior Publication Data

US 2019/0237396 A1    Aug. 1, 2019

Related U.S. Application Data

(63) Continuation of application No. 15/605,093, filed on May 25, 2017, now Pat. No. 10,297,536, which is a
(Continued)

(51) Int. Cl.
*H01L 23/495* (2006.01)
*H01L 23/31* (2006.01)
(Continued)

(52) U.S. Cl.
CPC .... *H01L 23/49541* (2013.01); *H01L 21/4825* (2013.01); *H01L 21/4835* (2013.01); *H01L 21/56* (2013.01); *H01L 23/3142* (2013.01); *H01L 23/49524* (2013.01); *H01L 23/49582* (2013.01); *H01L 23/49586* (2013.01); *H01L 24/00* (2013.01); *H01L 24/85* (2013.01); *H01L 24/97* (2013.01); *H01L 2224/45014* (2013.01); *H01L 2224/48247* (2013.01);
(Continued)

(58) Field of Classification Search
CPC ........... H01L 2224/73265; H01L 24/48; H01L 2224/45572; H01L 23/3142; H01L 24/32; H01L 23/49541; H01L 2224/04042; H01L 23/49513; H01L 23/49551; H01L 24/09
USPC .................................................. 257/666, 676
See application file for complete search history.

(56) References Cited

U.S. PATENT DOCUMENTS 4,707,724 A    11/1987  Suzuki et al.
4,942,454 A    7/1990   Mori et al.
(Continued)

FOREIGN PATENT DOCUMENTS

CN    101091245 A    12/2007
CN    104752386 A    7/2015
(Continued)

*Primary Examiner* — Luan C Thai
(74) *Attorney, Agent, or Firm* — Murphy, Bilak & Homiller, PLLC

(57) ABSTRACT

A semiconductor device includes a die paddle, a plurality of electrically conductive leads extending away from the die paddle, and an adhesion promoter plating material selectively formed on the electrically conductive leads such that outer portions of the leads are covered by the adhesion promoter plating material, and interior portions of the leads
(Continued)

that are disposed between the die paddle and the respective outer portions of each lead are substantially devoid of the adhesion promoter plating material.

20 Claims, 17 Drawing Sheets

Related U.S. Application Data continuation of application No. 14/866,050, filed on Sep. 25, 2015, now Pat. No. 9,704,786.

(51) Int. Cl.
    *H01L 23/00*     (2006.01)
    *H01L 21/48*     (2006.01)
    *H01L 21/56*     (2006.01)

(52) U.S. Cl.
    CPC ........... *H01L 2224/85011* (2013.01); *H01L 2224/85439* (2013.01); *H01L 2224/85444* (2013.01); *H01L 2224/85447* (2013.01); *H01L 2224/85455* (2013.01); *H01L 2224/85464* (2013.01); *H01L 2924/00014* (2013.01)

(56) References Cited

U.S. PATENT DOCUMENTS

| | | | |
|---|---|---|---|
| 4,985,751 A | | 1/1991 | Shiobara et al. |
| 5,022,968 A | * | 6/1991 | Lin .................. C25D 3/56 |
| | | | 205/141 |
| 5,122,858 A | | 6/1992 | Mahulikar et al. |
| 5,205,036 A | | 4/1993 | Yamazaki |
| 5,817,544 A | * | 10/1998 | Parthasarathi .......... H01L 23/10 |
| | | | 438/123 |
| 6,852,567 B1 | * | 2/2005 | Lee ................ H01L 23/3142 |
| | | | 438/106 |
| 7,374,971 B2 | | 5/2008 | Yuan et al. |
| 7,834,467 B2 | * | 11/2010 | Bauer ............... H01L 23/3142 |
| | | | 257/787 |
| 9,704,786 B2 | | 7/2017 | Dangelmaier et al. |
| 2007/0145606 A1 | | 6/2007 | Mahler et al. |
| 2015/0001691 A1 | * | 1/2015 | Higgins, III ............ H01L 21/56 |
| | | | 257/666 |

FOREIGN PATENT DOCUMENTS

| | | |
|---|---|---|
| CN | 106910729 A | 6/2017 |
| DE | 10124047 B4 | 12/2006 |
| WO | 2013022404 A1 | 2/2013 |

\* cited by examiner

US 11,024,565 B2

DIRECT SELECTIVE ADHESION PROMOTOR PLATING

PRIORITY CLAIM

This application is continuation of U.S. application Ser. No. 15/605,093 filed on 25 May 2017, which in turn is a continuation of U.S. application Ser. No. 14/866,050 filed on 25 Sep. 2015, patented as U.S. Pat. No. 9,704,786, the content of each application incorporated herein by reference their entirety.

TECHNICAL FIELD

The instant application relates to semiconductor packaging, and particularly relates to processes for enhancing adhesion between the conductive surface of a lead frame and the electrically insulating packaging material.

BACKGROUND

Integrated circuit devices, such as semiconductor chips, are commonly packaged using a lead frame and encapsulant material, such as a molding compound. For example, one or more semiconductor chips may be physically attached and electrically connected to a lead frame. The encapsulant material is formed around the semiconductor chip and electrical connections. The encapsulant protects the semiconductor chip and electrical connections from damaging environmental conditions, such as moisture, temperature, foreign particles, etc. The leads of the lead frame are externally accessible from outside of the encapsulant, and in some cases protrude away from the encapsulant. These outer portions of the leads provide external electrical terminals that allow the packaged device to be electrically connected to a printed circuit board, for example.

Many semiconductor processing technologies utilize lead frame strips to simultaneously package a number of semiconductor devices. A lead frame strip includes a number of unit lead frames continuously repeated on a sheet conductor, with openings in the sheet conductor defining the features of the unit lead frames. Each unit lead frame provides the lead construction for a single packaged device. One or more semiconductor dies can be affixed to and electrically connected with each unit lead frame. Eventually, the unit lead frames are singulated from one another to form individual packaged devices. The encapsulant may be molded on the lead frame before or after the unit lead frames are singulated.

In semiconductor packaging, delamination is a common problem in which the packaging material separates from the lead frame due to poor adhesion between the two. This may present an unacceptable risk that moisture and foreign particles will penetrate the package, and may result in a number of parts being discarded after inspection.

One technique for addressing the adhesion problem involves the application of an adhesion promoter to the lead frame prior to forming the encapsulant on the lead frame. However, effective adhesion promoters are typically non-conducting or at least interfere with conductive connections. Therefore, if the adhesion promoter is not removed from certain regions of the lead frame prior to wire bonding, there is a substantial possibility of wire bond failure. Known techniques for removing adhesion promotors from certain regions of the lead frame require multiple process steps that are costly and difficult to calibrate.

SUMMARY

A method of forming a packaged semiconductor device is disclosed. According to an embodiment, the method includes providing a lead frame strip having a plurality of unit lead frames. Each of the unit lead frames have a die paddle, a plurality of leads extending away from the die paddle, and a peripheral ring delineating interior portions of the leads from exterior portions of the leads. The method further includes selectively plating an adhesion promoter plating material within a package outline area of a first unit lead frame. The die paddle and the interior portions of the leads are disposed within the package outline area and the exterior portions of the leads are disposed outside of the package outline area. The method further includes processing wire bond sites in the first unit lead frame such that, after selectively plating the adhesion promoter plating material, the wire bond sites are substantially devoid of the adhesion promoter plating material. The wire bond sites are disposed within the package outline area and are spaced apart from the peripheral ring.

According to another embodiment, the method includes providing a lead frame strip having a plurality of unit lead frames. Each of the unit lead frames have a central opening and a plurality of leads extending away from the central opening. The method further includes selectively plating an adhesion promoter plating material on a first unit lead frame within a package outline area of on first portions of the leads. The method further includes molding an electrically insulating encapsulant material on the first portions of the leads such that the central opening is enclosed by a cavity formed by outer sidewalls of the encapsulant material.

According to another embodiment, the method includes providing a lead frame strip having a plurality of unit lead frames. Each of the unit lead frames have a die paddle and a plurality of leads extending away from the die paddle. A first one of the unit lead frames is plated with an adhesion promoter plating material within a package outline area of the first unit lead frame. The package outline area includes one of the die paddles and interior portions of the leads. Wire bond sites are processed in the first unit lead frame before or after the plating of the first lead frame such that, after the plating of the first lead frame. The wire bond sites are substantially devoid of the adhesion promoter plating material. The wire bond sites are disposed within the package outline area at an end of the interior portions of the leads that is closest to the die paddle.

According to another embodiment, the method includes providing a lead frame strip having a plurality of unit lead frames. Each of the unit lead frames have a central opening and a plurality of leads extending away from the central opening. An adhesion promoter plating material is selectively plated on a first unit lead frame within a package outline area of on first portions of the leads. An electrically insulating encapsulant material is formed on the first portions of the leads such that the central opening is enclosed by a cavity formed by outer sidewalls of the encapsulant material. Selectively plating the adhesion promoter plating material includes a single pass plating process. The single pass plating process includes providing a mask over the first unit lead frame, the mask covering the exterior portions of the leads and comprising openings that expose the elevated portions of the leads, and forming the adhesion promoter plating material in the openings.

A packaged semiconductor device is disclosed. According to an embodiment, the packaged semiconductor device includes a lead frame having a central opening and a plurality of leads extending away from the central opening. At least one of the leads has an elevated portion that is closer to the central opening than outer portions of the leads. The packaged semiconductor device further includes an electrically insulating encapsulant material formed on a package outline area of the lead frame such that the central opening is enclosed by a cavity formed by outer sidewalls of the encapsulant material. The packaged semiconductor device further includes an adhesion promoter plating material formed on the lead frame at an interface between the lead frame and the electrically insulating encapsulant material.

A packaged semiconductor device is disclosed. According to an embodiment, the packaged semiconductor device includes a lead frame having a central opening and a plurality of leads extending away from the central opening. At least one of the leads includes an elevated portion. The elevated portion is closer to the central opening than outer portions of the leads. An electrically insulating encapsulant material is formed on a package outline area of the lead frame such that the central opening is enclosed by a cavity formed by outer sidewalls of the encapsulant material. An adhesion promoter plating material is formed on the lead frame at an interface between the lead frame and the electrically insulating encapsulant material.

A semiconductor device is disclosed. According to an embodiment, the semiconductor device includes a die paddle, a plurality of electrically conductive leads extending away from the die paddle, and an adhesion promoter plating material selectively formed on the electrically conductive leads such that outer portions of the leads are covered by the adhesion promoter plating material, and interior portions of the leads that are disposed between the die paddle and the respective outer portions of each lead are substantially devoid of the adhesion promoter plating material.

According to another embodiment, the semiconductor device includes a plurality of leads extending away from a central opening such that interior ends of each lead face the opening, an adhesion promoter plating material formed on each one of the leads, and wire bondable material selectively formed on the electrically conductive leads such that the adhesion promoter plating material is covered by the wire bondable material on interior portions of the leads and such that the adhesion promoter plating material is exposed from the wire bondable material on outer portions of the leads. The interior portions of the leads that are disposed between the outer portions and the interior ends.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIG. 1A shows a top side of the lead frame strip and FIG. 1B shows the bottom side of the lead frame strip.

FIG. 2, which includes FIG. 2A shows a top side of the lead frame strip and FIG. 2B shows the bottom side of the lead frame strip.

FIG. 3, which includes FIG. 3A shows a top side of the lead frame strip and FIG. 3B shows the bottom side of the lead frame strip.

FIG. 10, which includes FIG. 10A shows a top side of the lead frame strip and FIG. 10B shows a cross-sectional view of the lead frame strip.

FIG. 11, which includes FIG. 11A shows a top side of the lead frame strip and FIG. 11B shows a cross-sectional view of the lead frame strip.

DETAILED DESCRIPTION

Embodiments of a method of forming a packaged semiconductor device are described herein. According to the method, a lead frame strip having a plurality of unit lead frames is provided. An adhesion promoter plating material is selectively applied within a package outline area of the unit lead frames. This process is a single pass, direct application process. For example, according to an embodiment, the unit lead frames are masked, and the adhesion promoter plating material is only formed in regions that are exposed from the mask.

The inventors have found that there are many advantages to a direct selective adhesion plating process in comparison to conventional techniques, which may include non-selective plating of an adhesion promoter followed by an etching process, for example. However, in a direct selective adhesion plating process, the possibility exists that a small amount of the adhesion promoter will encroach into the wire bond sites. The embodiments described herein address this issue by performing one or more processing steps to the wire bond sites in the lead frame strip before or after (or both before and after) the selective plating of the adhesion promoter. For example, the wire bond sites may be chemically treated and/or may be spot plated with a wire bondable layer (e.g., Silver). These processing steps ensure that the wire bond sites are substantially devoid of the adhesion promoter plating material before wire bonding. Thus, the processing steps allow for the lead frame strip to be plated by a direct selective adhesion plating process without the adhesion promoter plating material interfering with the formation of wire bonds.

Figure 1A:
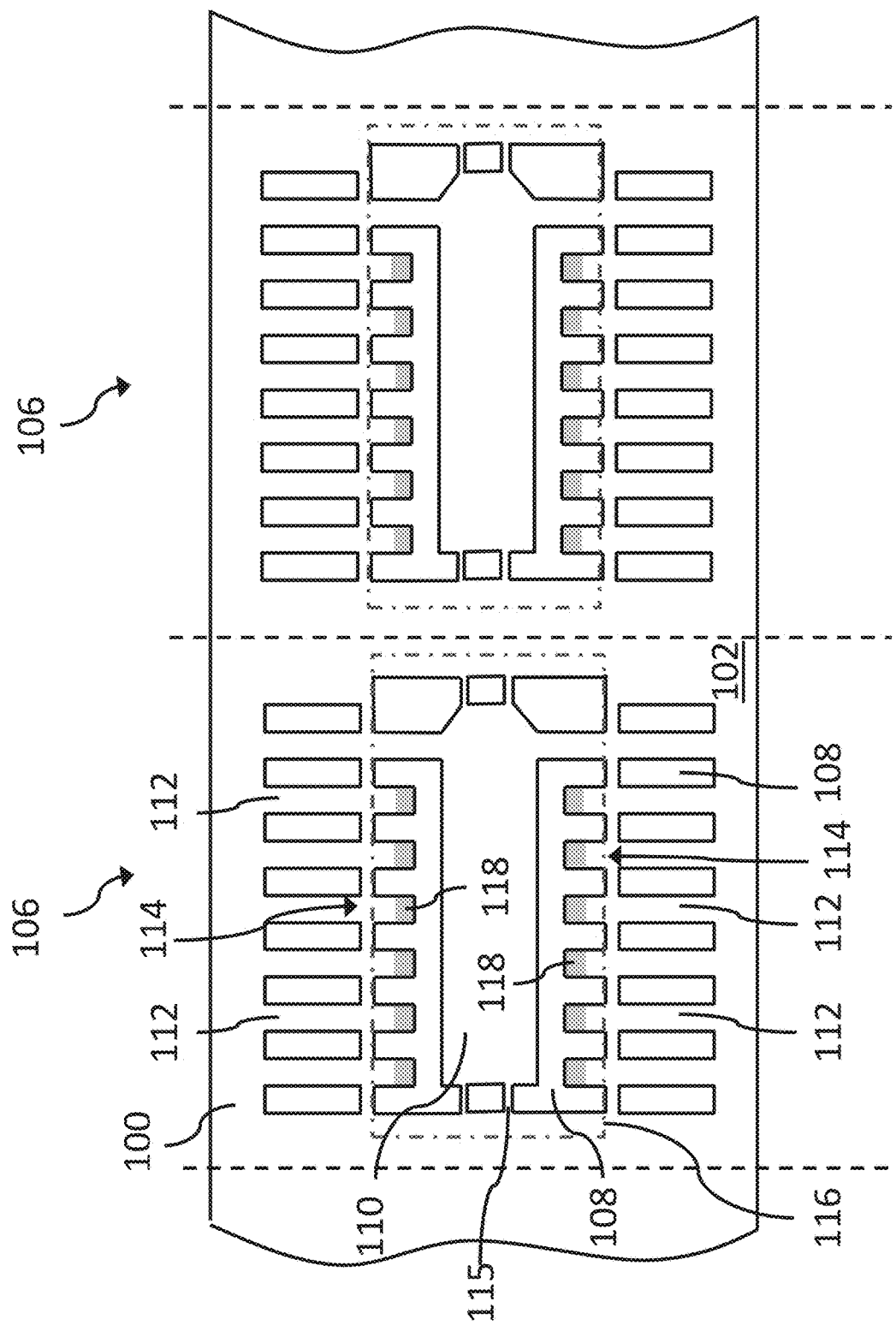
FIGS. 1A and 1B, illustrates a lead frame strip that may be selectively plated, according to an embodiment.
Figure 1B:
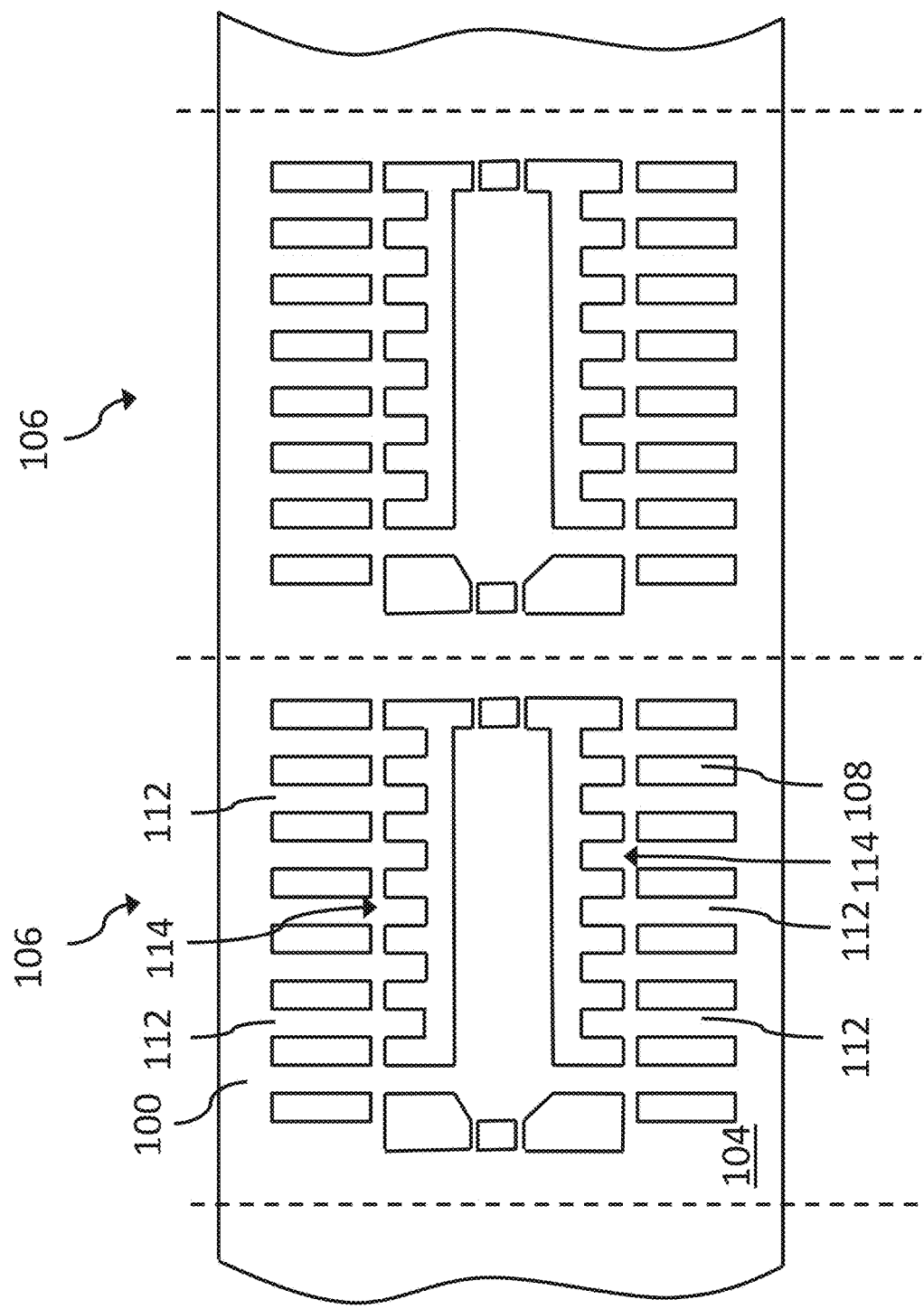

Referring to FIG. 1, a plan view of a lead frame strip 100 is depicted, according to an embodiment. The top side 102 (i.e., the die attachment side) of the lead frame strip 100 is depicted in FIG. 1A and the bottom side 104 of the lead frame strip 100 is depicted in FIG. 1B. The lead frame strip 100 includes a plurality of unit lead frames 106, two of which are depicted in FIG. 1. For the purposes of explanation, a first unit lead frame 106 will be discussed. It will be appreciated by those of ordinary skill that the first unit lead frame 106 may be replicated a number of times (e.g., tens, hundreds, etc.) in the lead frame strip 100, and that the configurations and processing steps discussed with reference to the first unit lead frame 106 are universally applicable to every other one of the unit lead frames 106 in the lead frame strip 100.

The lead frame strip 100 may be formed from a sheet layer of electrically conductive material (e.g., copper, aluminum and the like). Openings 108 are formed in the sheet metal that define the features of the unit lead frames 106. The openings 108 may be formed by stamping or etching, for example.

The first unit lead frame 106 includes a die paddle 110 and a plurality of leads 112 extending away from the die paddle 110. A peripheral ring 114 delineates interior portions of the leads 112 from exterior portions of the leads 112. The peripheral ring 114 is an interior ring of the first unit lead frame 106 that surrounds the die paddle 110. The interior portions of the leads 112 are spaced closest to the die paddle 110 and the exterior portions of the leads 112 are arranged further away from the die paddle 110, on an opposite side of the peripheral ring 114 as the interior portions of the leads 112. The die paddle 110 may be connected to one of the leads 112 to connect the die paddle 110 to allow the die paddle to be connected to a reference potential in the finalized device. In a lead trimming step, portions of the peripheral ring 114 that connect the leads 112 together are removed so that the leads 112 are electrically distinct from one another. The first unit lead frame 106 may further include tie bars 115 that physically support the die paddle 110 after the leads 112 are trimmed.

A package outline area 116 represents where a protective encapsulate material, such as a molding compound, is formed on the first unit lead frame 106. The package outline area 116 encompasses the die paddle 110 and the interior portions of the leads 112. The exterior portions of the leads 112 are at least partially outside of the package outline area 116 and thus protrude out of the encapsulant material to provide electrical terminals of the packaged device.

FIG. 1A further depicts wire bond sites 118 that are disposed within the package outline area 116. In order to form an electrical connection between the semiconductor device(s) mounted to the die paddle 110 and the leads 112, wire bonds (e.g., conductive bond wire, ribbon, etc.) can be used. The wire bond sites 118 represent locations at which the wire bonds are connected to the leads 112 of the packaged device. The wire bond sites 118 are disposed within the package outline area 116 and are spaced apart from the peripheral ring 114. That is, the wire bond sites 118 do not intersect with the package outline area 116. Rather, the wire bond sites 118 are only disposed on portions of the interior portions of the leads 112 that are closest to the die paddle 110. Optionally, the leads 112 may be locally enlarged at the wire bond sites 118 relative to the area of the portions of the leads 112 extending between the wire bond sites 118 and the peripheral ring 114.

Figure 2A:
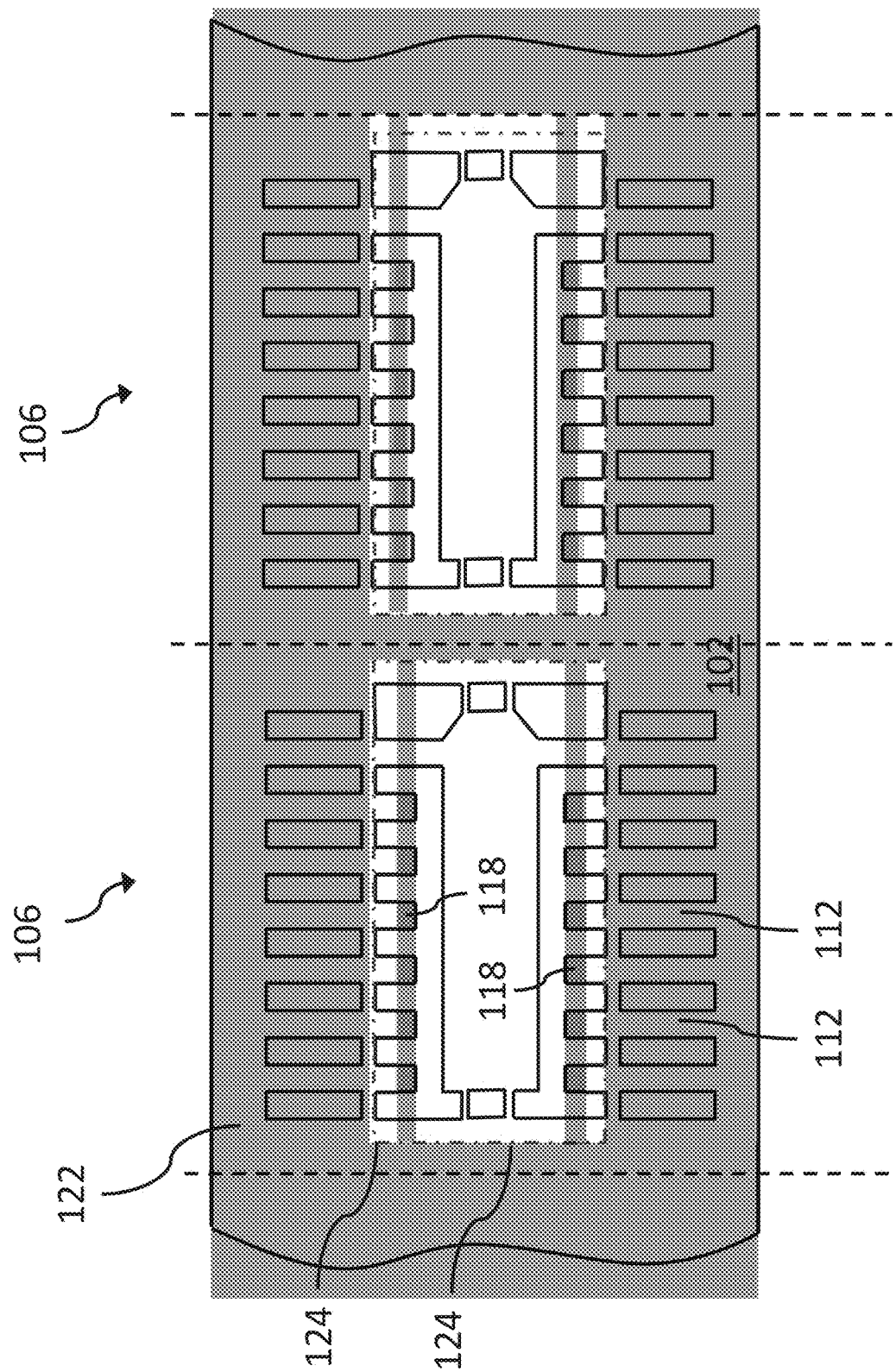
FIGS. 2A and 2B, illustrates a mask being provided over the lead frame strip, according to an embodiment.
Figure 2B:
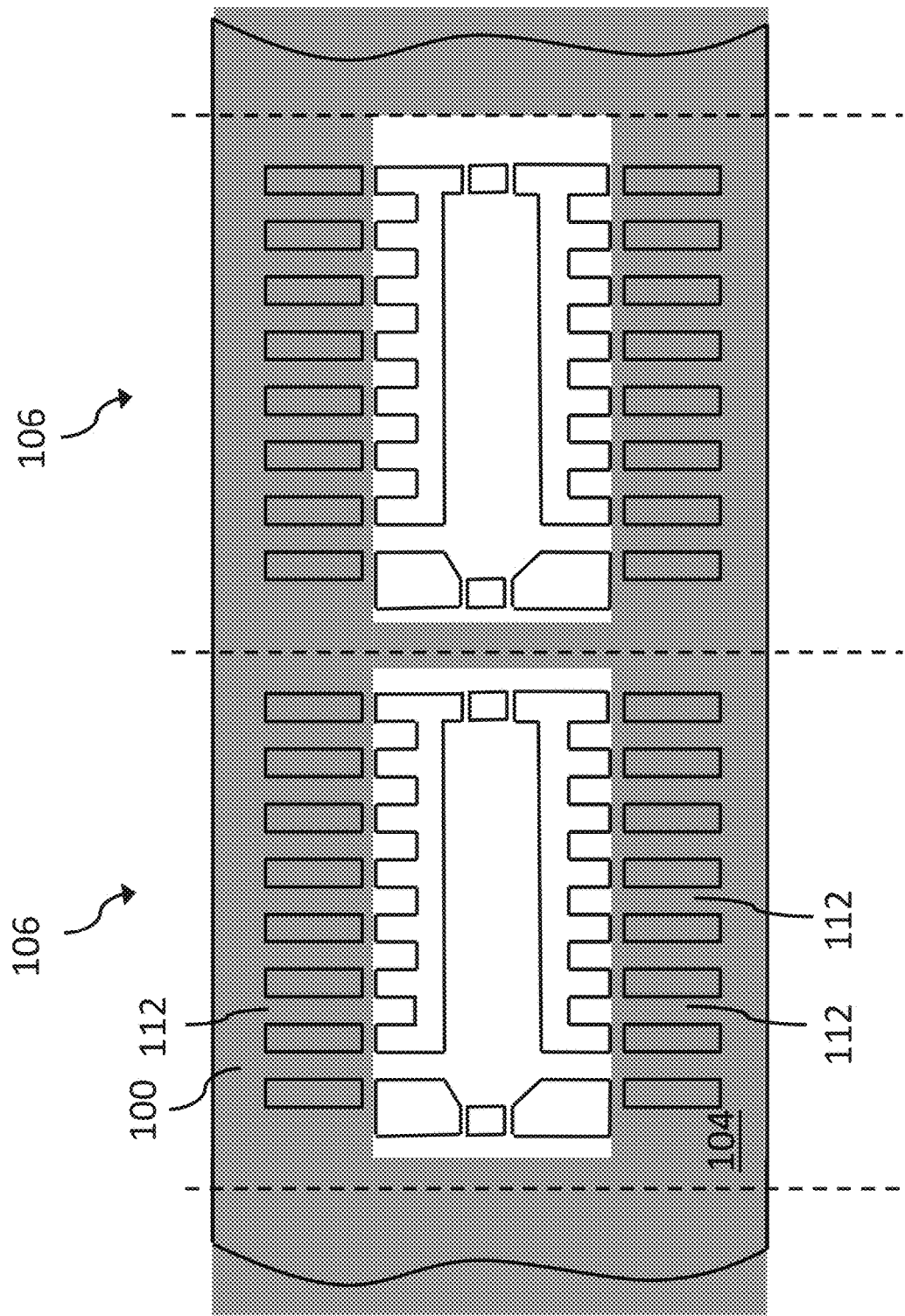

Referring to FIGS. 2-3, a process for selectively forming an adhesion promoter plating material 120 within the package outline area 116 of the first unit lead frame 106 is depicted, according to an embodiment. The top side 102 of the lead frame strip 100 is depicted in FIG. 2A and the bottom side 104 of the lead frame strip 100 is depicted in FIG. 2B. This process is a single pass process whereby the adhesion promoter plating material 120 is directly applied to pre-selected portions of the lead frame. According to the method, a mask 122 is provided over the first unit lead frame 106. The mask 122 includes one or more openings 124 that at least partially expose pre-selected regions of the first unit lead frame 106 within the package outline area 116. The mask 122 covers pre-selected areas that are preferably devoid of (i.e., not covered with) the adhesion promoter plating material 120. The geometry of the mask 122 in FIG. 2A represents just one example, and in general any mask geometry that is technically feasible may be used to define pre-selected regions of the lead frame strip 100 that should contain or be devoid of the adhesion promoter plating material 120.

Figure 3A:
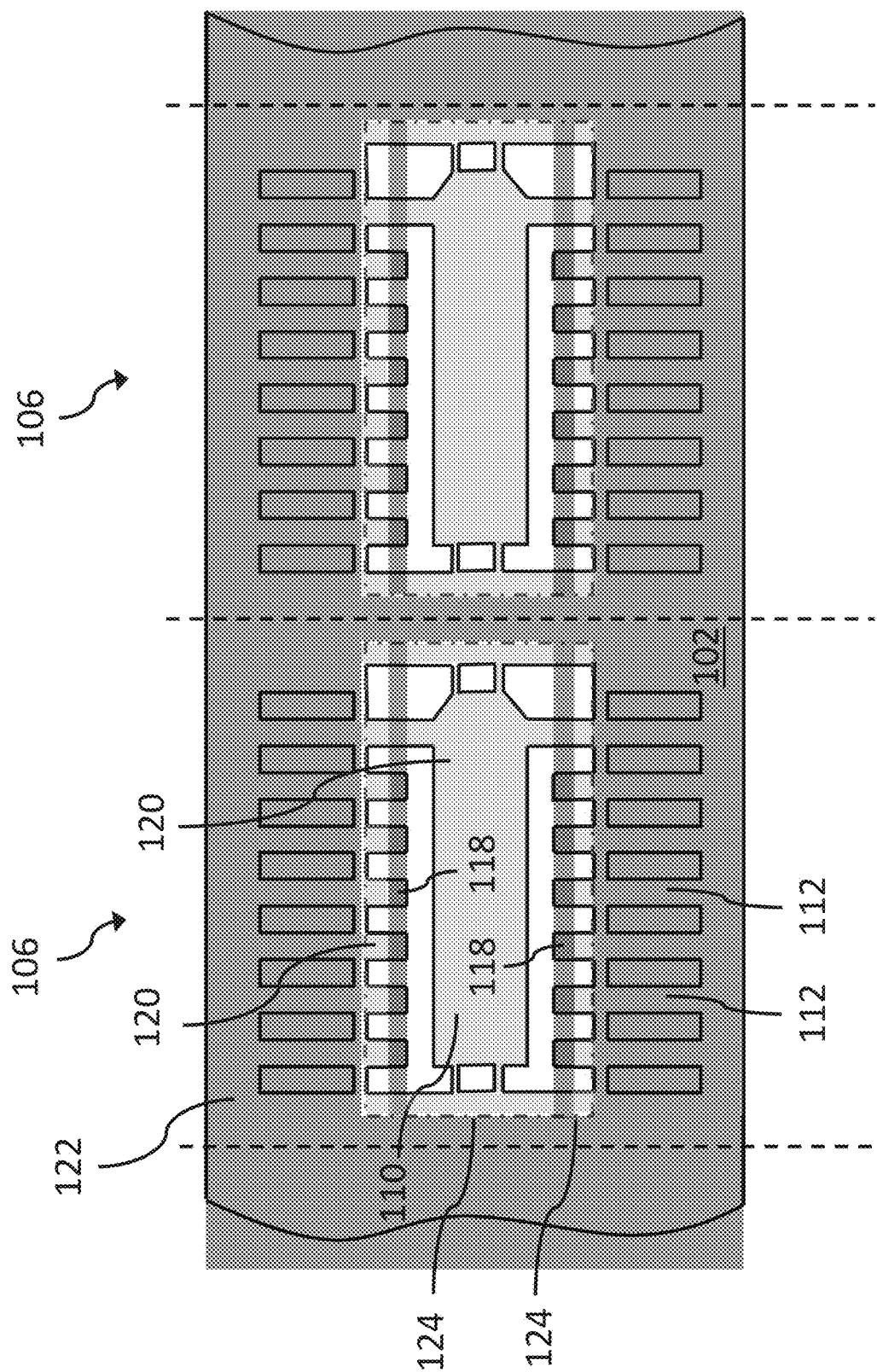
FIGS. 3A and 3B, illustrates the lead frame strip after adhesion promoter plating material is selectively formed within openings of the mask, according to an embodiment.
Figure 3B:
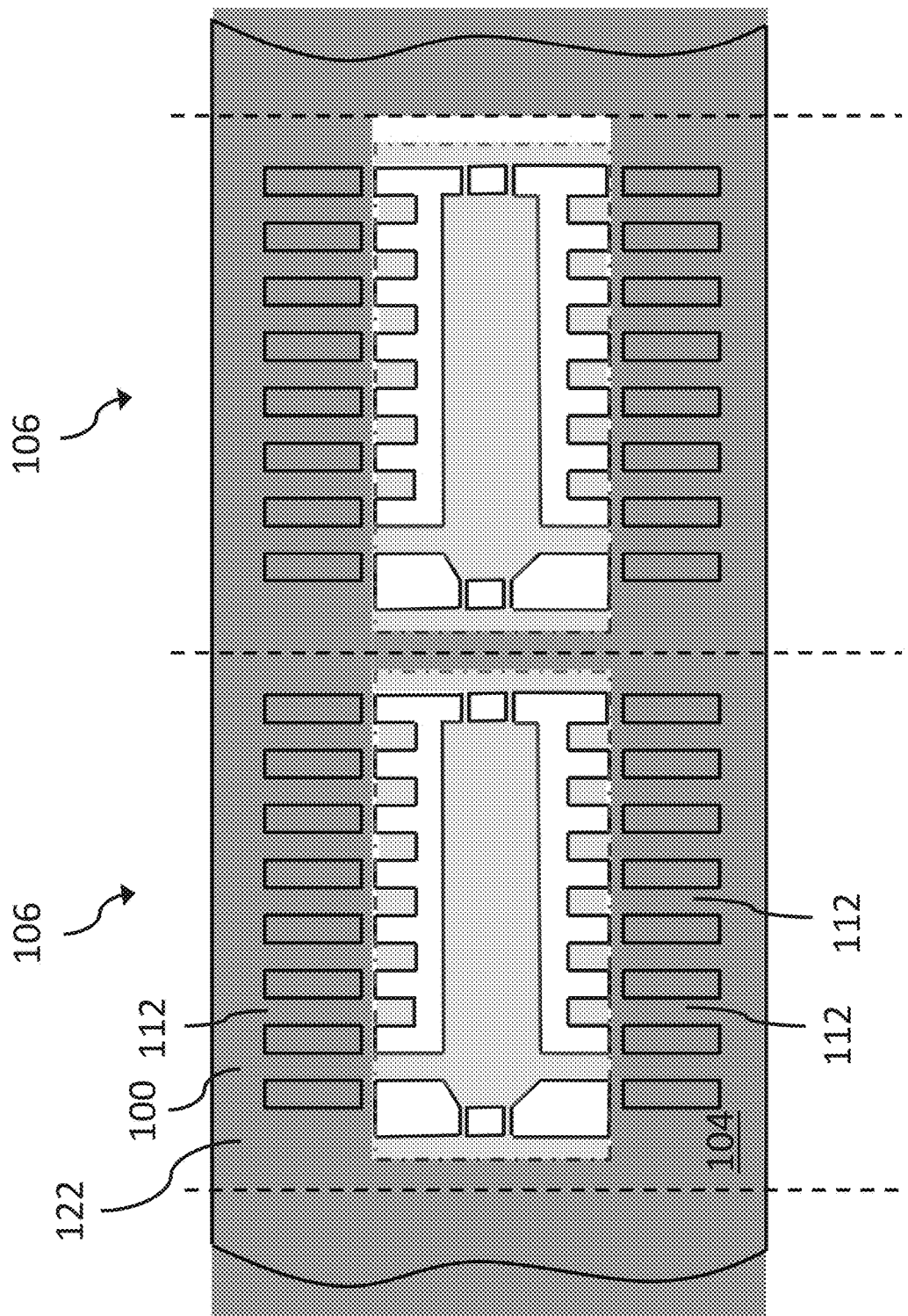

Referring to FIG. 3, the adhesion promoter plating material 120 has been selectively formed on the lead frame strip 100. The top side 102 of the lead frame strip 100 is depicted in FIG. 3A and the bottom side 104 of the lead frame strip 100 is depicted in FIG. 3B. Exposed portions of the lead frame strip 100 are plated with the adhesion promoter plating material 120 and the mask 122 nominally prevents the adhesion promoter plating material 120 from forming in any of the covered areas.

The adhesion promoter plating material 120 may generally be any material that enhances the bond between electrically insulating packaging material (e.g., a thermoset plastic) and an electrically conductive material that is disposed on a surface of the lead frame (e.g., copper, aluminum, silver, etc.). According to an embodiment, the adhesion promoter plating material 120 is a Zinc based compound. For example, the adhesion promoter plating material 120 may be an alloy of Zinc and Chromium (e.g., ZnCr). Other suitable Zinc based alloys for the adhesion promoter plating material 120 include ZnMo or ZnV. According to an embodiment, the adhesion promoter plating material 120 is formed by an electrolytic plating process in which the lead frame strip 100 is immersed in an electrolytic fluid and acts as an anode under an applied current. In this embodiment, the mask 122 prevents the covered region from being plated with the adhesion promoter plating material 120.

Figure 4:
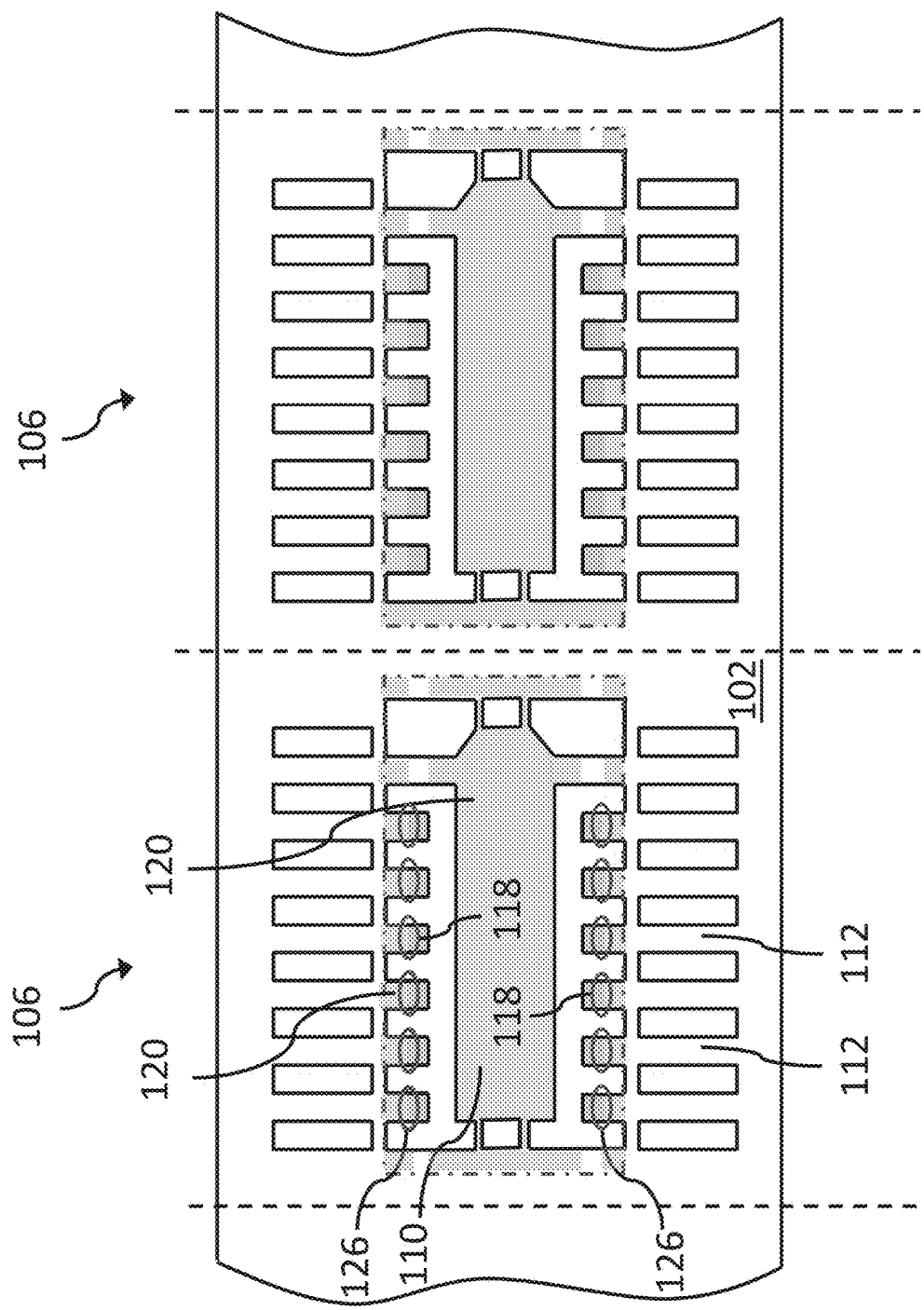
FIG. 4 illustrates a top side of the lead frame strip after the mask has been removed, according to an embodiment.

Referring to FIG. 4, a top side 102 of the lead frame strip 100 is depicted after removal of the mask 122. In the figure, transitional regions 126 of the interior portions of the leads 112 have been encircled. These transitional regions 126 correspond to areas at or near the boundary between the adhesion promoter plating material 120 and the wire bond sites 118. Without further measures, the adhesion promoter plating material 120 may skew too close to the die paddle 110 so as to encroach upon the wire bond sites 118 in the transitional regions 126. That is, the transitional regions 126 represent regions that should preferably be devoid of the adhesion promoter plating material 120, but in some cases are not. Many variables that are difficult or impossible to control contribute to the problem. For example, the minimum opening size of the mask 122 may be such that the adhesion promoter plating material 120 extends too far into the wire bond sites 118. Process variation also contributes to this effect. Further, even in the case of a properly sized and aligned mask 122, some adhesion promotor plating material may leak into the wire bond sites 118 after the plating process. Because the adhesion promoter plating material 120 is non-conductive, it may be difficult or impossible to form wire bonds at the wire bond sites 118 if there is too much of the adhesion promoter plating material 120 present in the transitional regions 126.

A variety of processing steps are disclosed herein to mitigate the above described phenomenon and remove (or cover) the adhesion promoter plating material 120 that forms in the transitional regions 126. According to these embodiments, the wire bond sites 118 in the first unit lead frame 106 are processed such that, after selectively plating the adhesion promoter plating material 120, the wire bond sites 118 are substantially devoid of the adhesion promoter plating material 120. That is, the wire bond sites 118 are processed to prevent the adhesion promoter plating material 120 from encroaching too far toward the die paddle 110 and create an unacceptably high risk of wire bond failure. These processing steps may be performed on the lead frame strip 100 before the selective plating of the adhesion promoter plating material 120, after the selective plating of the adhesion promoter plating material 120, or before and after the selective plating the adhesion promoter plating material 120. Furthermore, any of the processing steps may be combined with one another. The term "substantially devoid" as used herein means that, while trace amounts of the adhesion promoter plating material 120 may be present on the wire bond sites 118, the amount of adhesion promoter plating material 120 remains below a maximum threshold so as to ensure that a conductive connection (e.g., with wire bonds) can be effectuated at the wire bond sites 118.

Figure 5:
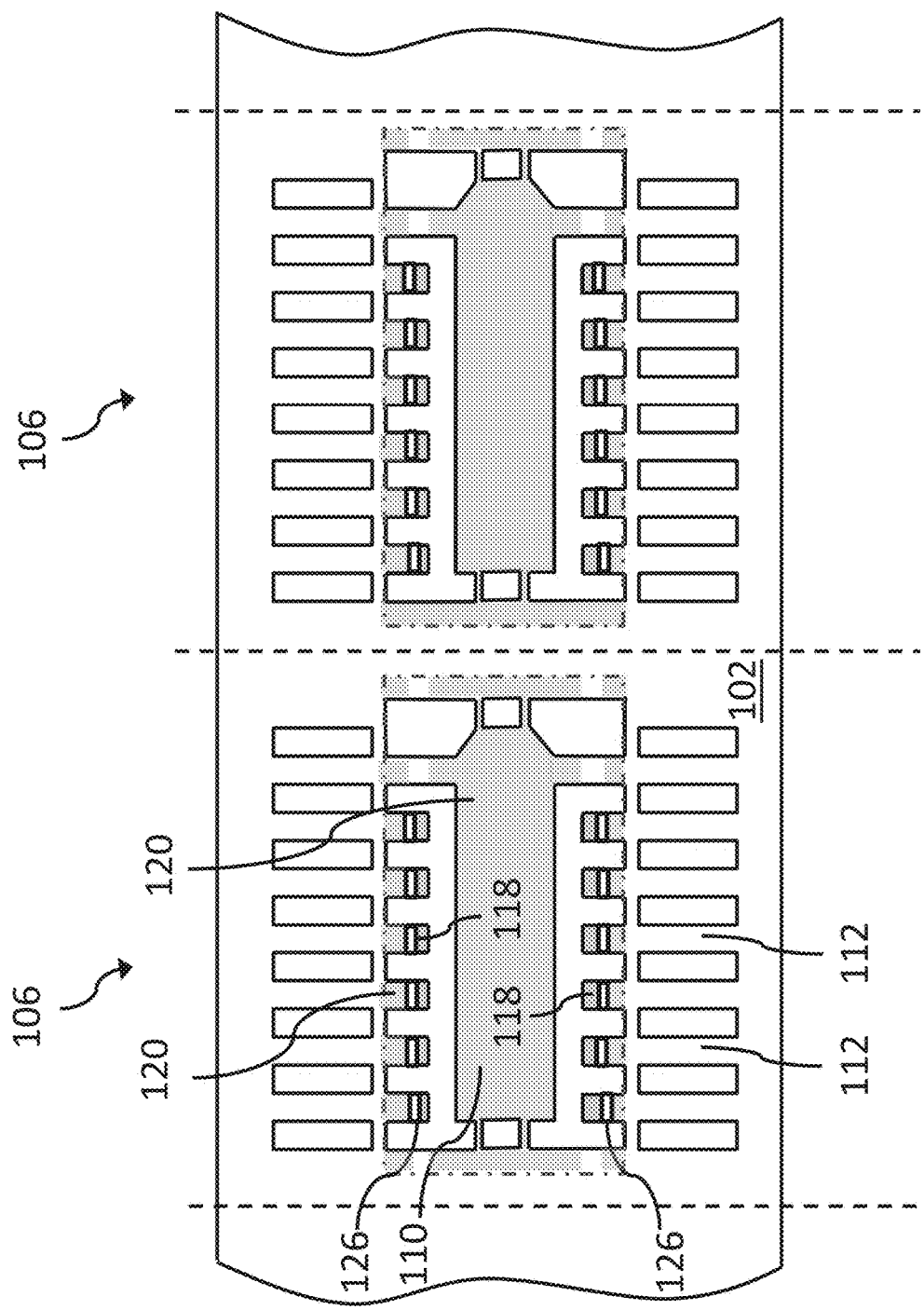
FIG. 5 illustrates a top side of a lead frame strip that has been processed by a chemical treatment process, according to an embodiment.

Referring to FIG. 5, a top side 102 of the lead frame strip 100 is depicted after the selective plating of the adhesion promoter plating material 120 as described with reference to FIGS. 2-4. In this embodiment, the lead frame strip 100 has been subjected to a chemical treatment process, either before or after the selective plating of the adhesion promoter plating material 120 as described with reference to FIGS. 2-3. As a result, the transitional regions 126 are substantially devoid of the adhesion promoter plating material 120.

According to one embodiment, a chemical treatment process is applied to the first unit lead frame 106 prior to selectively plating the first unit lead frame 106 with the adhesion promoter plating material 120. For example, the lead frame strip 100 may be submerged in a chemically reactive solution. Exemplary chemically reactive solutions that are suitable for this process include an anti-immersion or anti-tarnish chemical inhibitor such as an Organosulphur acid based e.g., 2-thiobarbituric acid, triazole derivatives e.g., Benzatriazole, and imidazoles, etc. Alternatively, a Silane based solution such as Mercapto silane, Sodium metasilicate, tripolyphosphate, etc. may be used. This chemical treatment process prevents the adhesion promoter plating material 120 from forming on select portions (e.g., the wire bond sites 118) of the interior portions of the leads 112. Thus, the adhesion promoter plating material 120 does not encroach upon the wire bond sites 118 during the selective application of the adhesion promoter plating material 120 described with reference to FIG. 4.

According to another embodiment, after selectively plating the adhesion promoter plating material 120, portions of the adhesion promoter plating material 120 that form on the wire bond sites 118 during the plating process are removed. This removal of the adhesion promoter plating may be done, e.g., by a chemical reaction process. For example, a chemical cleaning solution such as Potassium hydroxide, Ammonium acetate, Potassium lactate, and Acetone may be applied to the wire bond sites 118. This process may be a selective or non-selective and may be an electrolytic or non-electrolytic process. For example, in a selective cleaning process, a mask may be used to only remove the adhesion promoter plating material 120 from preselected areas (e.g., the wire bond sites 118 or portions of the wire bond sites 118). Alternatively, in a non-selective cleaning process, the chemical cleaning solution may be exposed to the entire lead frame strip 100 for a predetermined duration to remove some of the adhesion promoter plating material 120.

Figure 6:
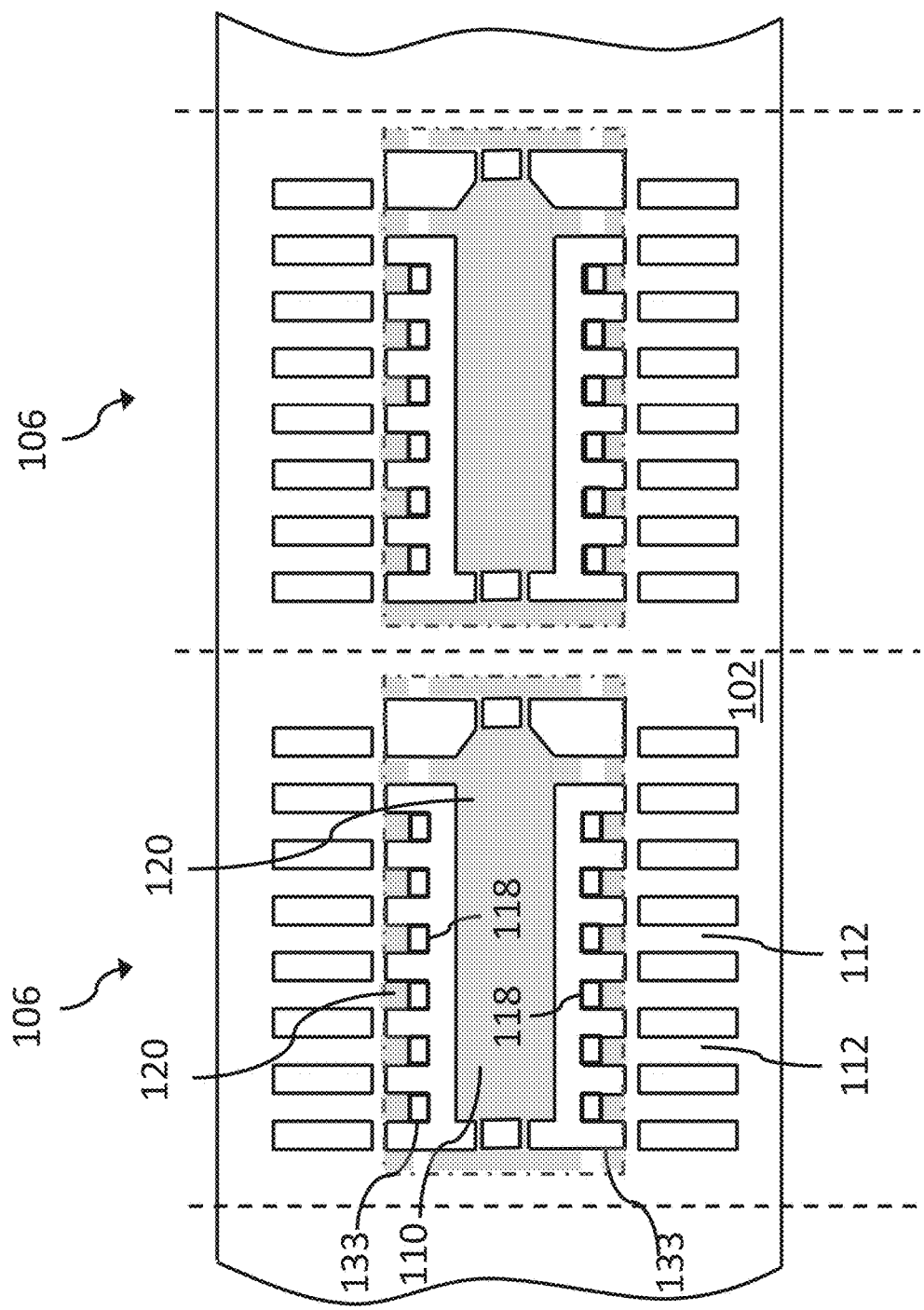
FIG. 6 illustrates a top side of a lead frame strip that has been processed by a laser cleaning process, according to an embodiment.

Referring to FIG. 6, a top side 102 of the lead frame strip 100 is depicted after the selective plating of the adhesion promoter plating material 120 as described with reference to FIGS. 2-4. In this embodiment, the lead frame strip 100 has been subjected to a selective laser cleaning leakage regions 127 that encompass the wire bond sites 118. This selective laser cleaning is performed after the selective plating of the adhesion promoter plating material 120 as described with reference to FIGS. 2-4. Various laser parameters are possible. The laser selective laser cleaning may slightly reduce the thickness of the material beneath the adhesion promoter plating material 120 (e.g., silver) so that the adhesion promoter plating material 120 can be removed completely. Removal of unwanted plating can be performed by laser machine programming, for example. Laser cleaning can be applied on different metal surfaces (Cu, Ag, Ni, pre-plating layer stacks etc.).

Figure 7:
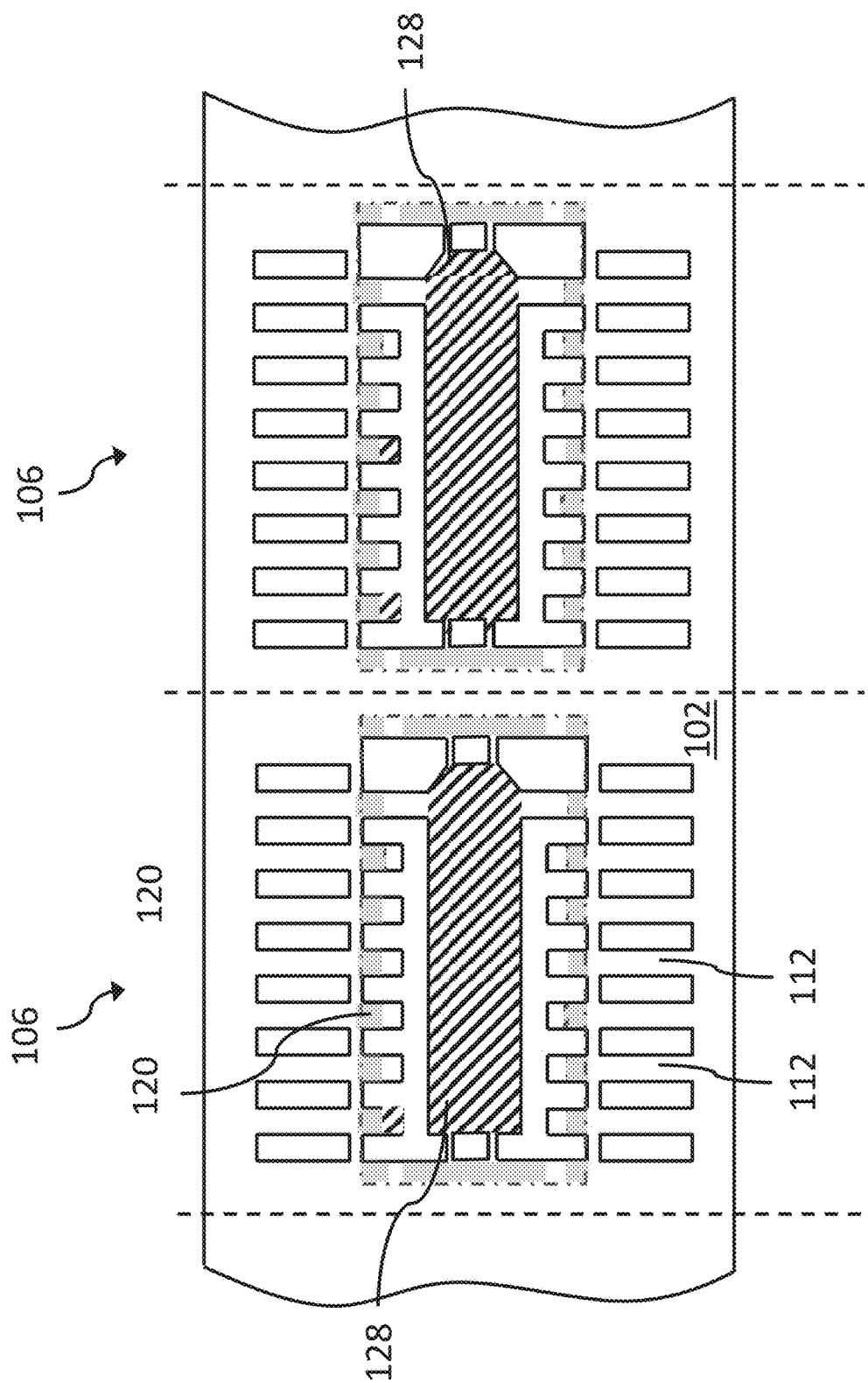
FIG. 7 illustrates a top side of a lead frame strip with a wire bondable layer being formed on the wire bond sites of the lead frame, according to an embodiment.

Referring to FIG. 7, a top side 102 of the lead frame strip 100 is depicted after the selective plating of the adhesion promoter plating material 120 as described with reference to FIGS. 2-4. In this embodiment, the lead frame strip 100 has been subjected to a plating process whereby any adhesion promoter plating material 120 that is present in the wire bond sites 118 is covered (e.g., plated) with a wire bondable layer 128. The wire bondable layer 128 may generally be any electrically conductive material that is suitable for the formation of wire bonds thereon. According to an embodiment, the wire bondable layer 128 is a layer of Silver (Ag). Alternatively, the wire bondable layer 128 may be formed from Palladium (Pd), Gold (Au), Nickel (Ni), Copper (Cu), and alloys thereof.

According to an embodiment, the wire bondable layer 128 is formed by a so-called spot plating technique. According to this technique, the wire bondable material (e.g., silver) is directly applied to the first unit lead frame 106 in preselected locations. As can be seen, the pre-selected locations are within the package outline area 116 and encompass the die paddle 110 and the wire bonding portions of the leads 112. Any adhesion promotor that forms on the wire bonding portions of the leads 112 or near the wire bonding portions of the leads 112 is covered by the wire bondable layer 128. However, the spot plating is constrained within a window such that it does not form near the package outline or the peripheral ring 114. Thus, in these regions, the adhesion promoter plating material 120 remains exposed and will adhere to the packaging material that is formed thereon. The wire bondable layer 128 may be formed before and after application of the adhesion promoter plating material 120. For example, the wire bondable layer 128 may first be formed on the lead frame strip 100 prior to the process steps described with reference to FIGS. 2-3. Afterwards, a re-plating process may be applied so as to form another wire bondable layer 128.

Figure 8:
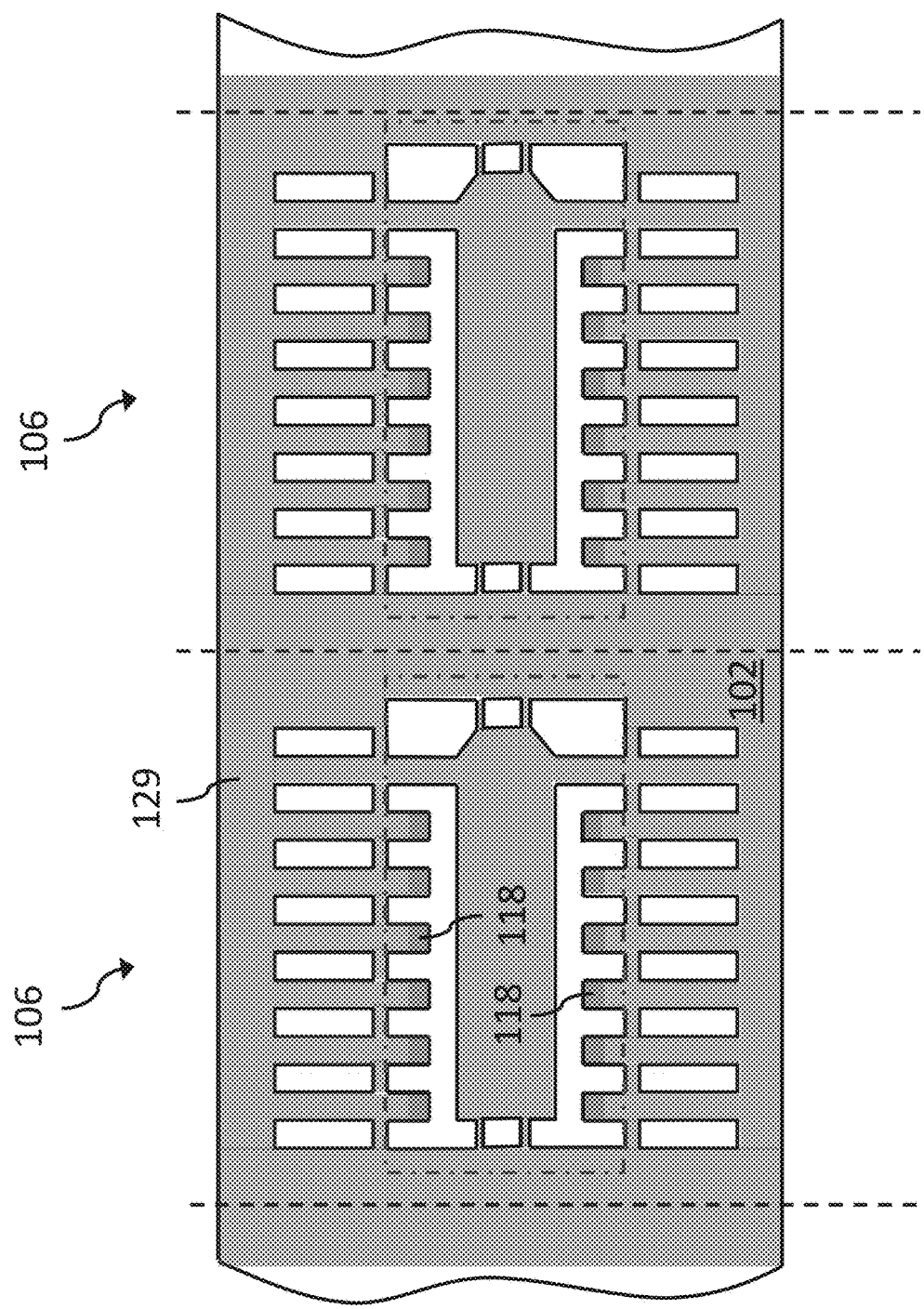
FIG. 8 illustrates a top side of a lead frame strip with a corrosion resistance coating that can be used to prevent the adhesion promoter plating material from forming in select locations, according to an embodiment.

Referring to FIG. 8, a top side 102 of the lead frame strip 100 is depicted before the selective plating of the adhesion promoter plating material 120 as described with reference to FIGS. 2-4. According to the technique depicted in FIG. 8, the entire lead frame strip 100 is coated with a corrosion resistance coating 129 using pore blocker chemistry techniques, including include bisphenol, ether based chemistry, Benzothiazole, etc. The corrosion resistance coating 129 forms a hydrophobic layer on the entire top side 102, including the wire bond sites 118, as well as bottom side 104 (not shown in FIG. 8). The corrosion resistance coating 129 can be used to inhibit the formation of the adhesion promoter plating material 120 in any desired area, including the wire bond sites 118 and the transitional regions 126. The adhesion promoter plating material 120 cannot be deposited at these locations by immersion or low current flow. However, the adhesion promoter plating material 120 can be selectively applied to other areas in which it is preferably present (e.g., the peripheral ring 114). The corrosion resistance coating 129 can be applied prior to the selective plating of the adhesion promoter plating material 120 as described with reference to FIGS. 2-4, and can remain on the wire bond sites 118 during wire bonding without interfering with the wire bonds, due to the minimal thickness of the corrosion resistance coating 129.

Figure 9:
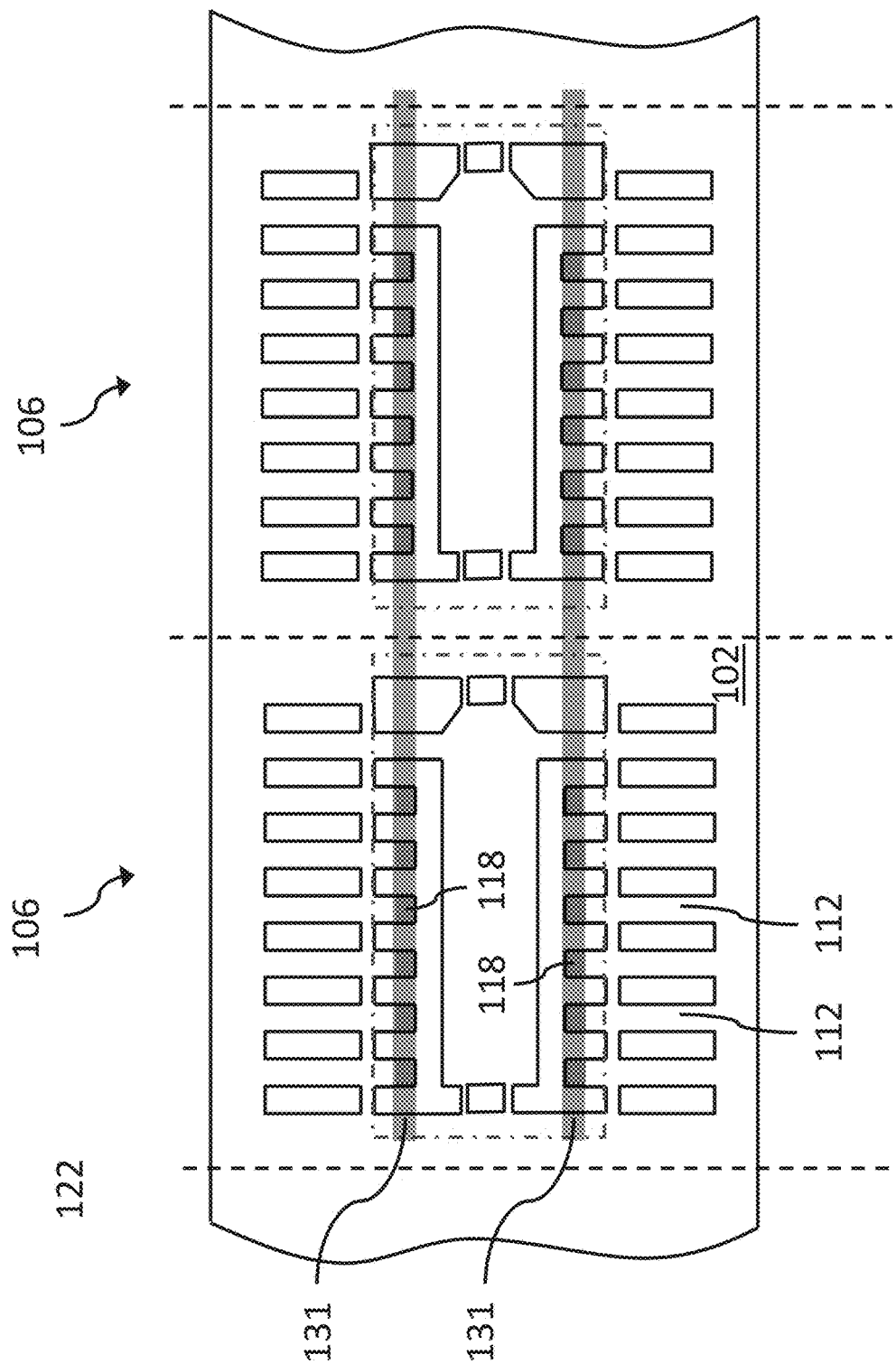
FIG. 9 illustrates a top side of a lead frame strip with a pre-mask tape that can be used to prevent the adhesion promoter plating material from forming in select locations, according to an embodiment.

Referring to FIG. 9, a top side 102 of the lead frame strip 100 is depicted before the selective plating of the adhesion promoter plating material 120 as described with reference to FIGS. 2-3. According to this technique, an additional masking step is performed prior to the masking step of FIG. 2 to provide additional coverage over the wire bond sites 118 and prevent the adhesion promoter plating material 120 from forming in these regions. This additional masking step may include applying a pre-taping method, whereby a tape 131 is applied to the lead frame strip 100. The tape 131 may be any commonly used tape for lead stabilization, such as polyethelene (PE) or polyester (PET) tape.

Figure 10A:
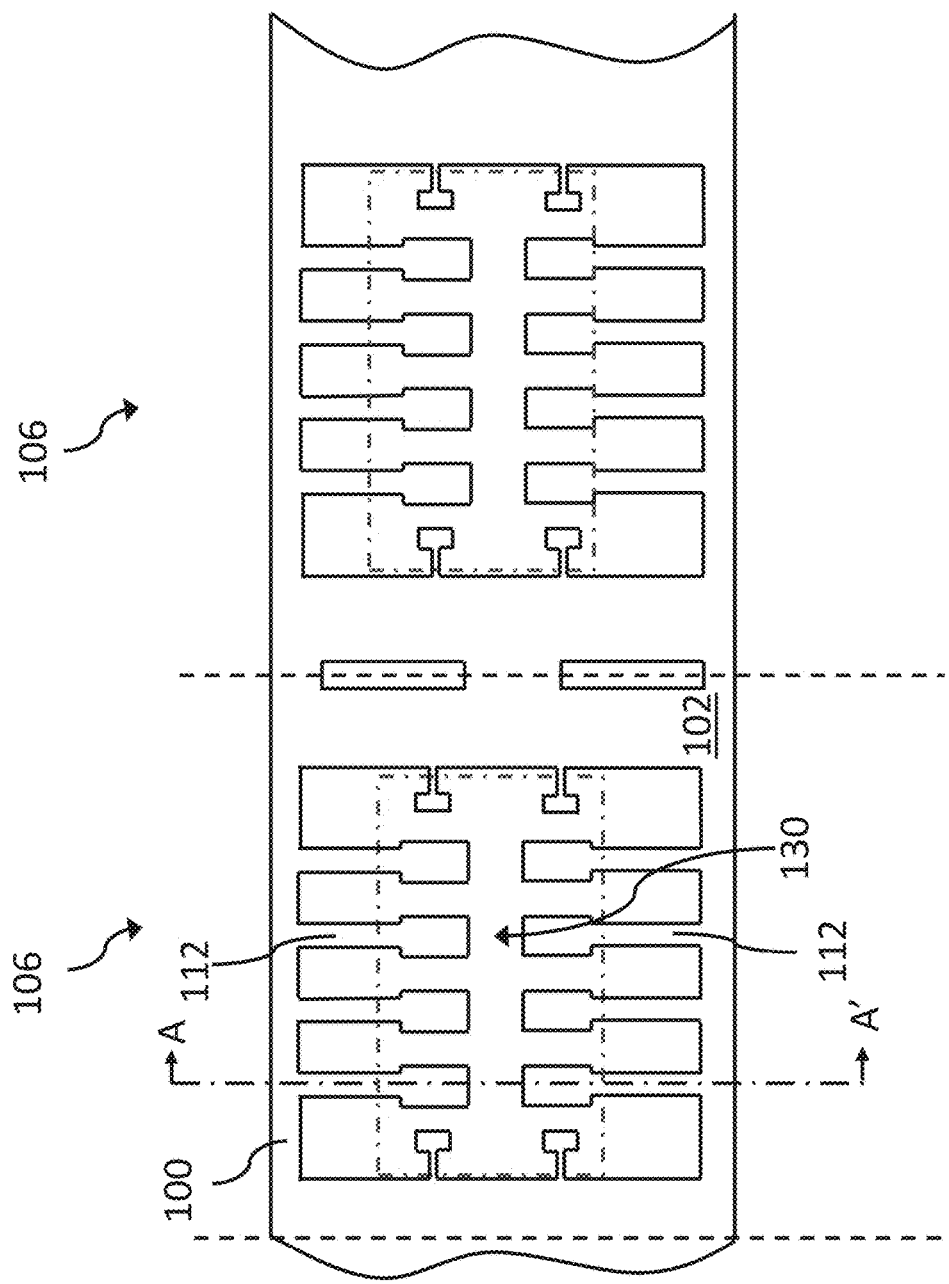
FIGS. 10A and 10B, illustrates another configuration of a lead frame strip that may be selectively plated, according to an embodiment.
Figure 10B:
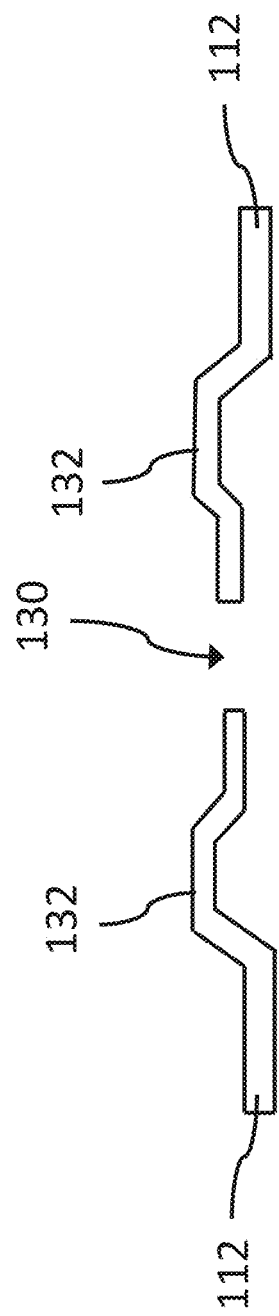

Referring to FIG. 10, a differently configured lead frame strip 100 is depicted. The top side 102 (i.e., the die attachment side) of the lead frame strip 100 is depicted in FIG. 10A. FIG. 10B depicts the lead frame strip 100 along the cross sectional line A-A' depicted in FIG. 10A. In this embodiment, the lead frame strip 100 is configured to be pre-molded with a package outline structure prior to singulation of the first unit lead frames 106.

The lead frame strip 100 may include the same materials and may be formed according to the same techniques as the lead frame strip 100 described with reference to FIGS. 1-9. The lead frame strip 100 is configured differently from the lead frame strip 100 of FIGS. 1-9 at least in the following way. First of all, there is no die paddle 110 in the lead frame strip 100 of FIG. 10. Instead, the each of the unit lead frames 106 has a central opening 130. The unit lead frames 106 additionally include a plurality of leads 112 extending away from the central opening 130. This configuration may be used for a sensor package structure in which the sensor device is placed over the central opening 130. The central opening 130 can provide access to outside of the package so that the sensor device can measure and exterior environmental parameter.

Referring to the side profile view of FIG. 10B, it can be seen that the lead frame strip 100 may have a bent lead configuration. More particularly, an elevated portion 132 is provided in first portions of the leads 112. That is, the leads 112 do not extend along a single plane. Rather, the leads 112 include a vertical bend and an elevated portion 132 that is spaced above outer portions of the leads 112. The elevated portion 132 is closer to the central opening 130 than outer portions of the leads 112. Furthermore, the leads 112 may bend downward at inner portions of the leads 112 that are adjacent the central opening 130.

Figure 11A:
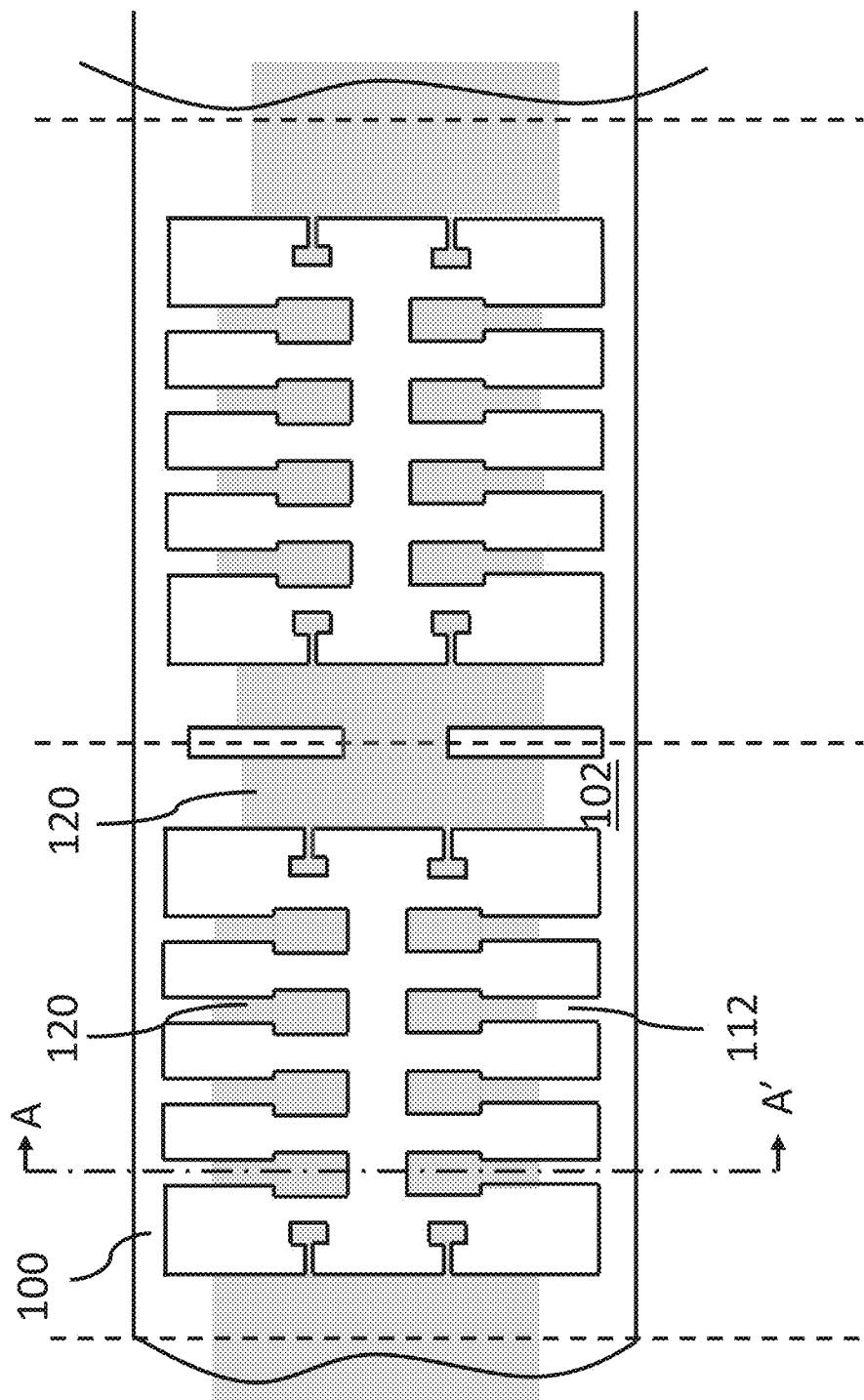
FIGS. 11A and 11B, illustrates the lead frame strip of FIG. 10 after an after adhesion promoter plating material is selectively formed.
Figure 11B:
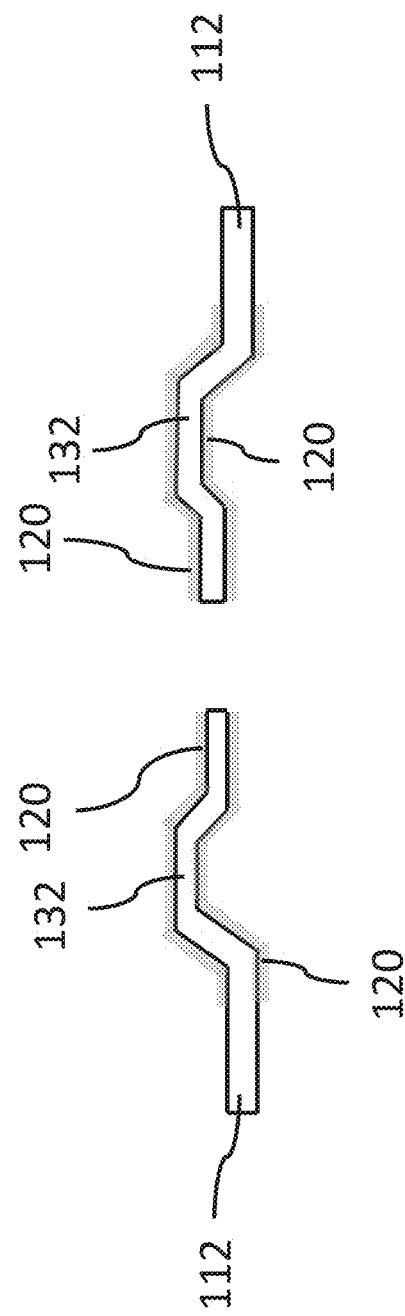

Referring to FIG. 11, an adhesion promoter plating material 120 is selectively applied within a package outline area 116 of the first unit lead frame 106. The top side 102 (i.e., the die attachment side) of the lead frame strip 100 is depicted in FIG. 11A. FIG. 11B depicts the lead frame strip 100 along the cross sectional line A-A' depicted in FIG. 11A. The adhesion promoter plating material 120 may be formed on the lead frame strip of FIG. 1 in a process that is substantially similar or identical to the selective plating process described with reference to FIGS. 2-4. For example, the adhesion promoter plating material 120 may be selectively plated by providing a mask 122 over the first unit lead frame 106 and forming the adhesion promoter plating material 120 in opening(s) of the mask 122 (e.g., by electroplating). According to an embodiment, the adhesion promoter plating material 120 is selectively formed on the first portions of the leads 112, which include the elevated portions 132, as is depicted in FIG. 11B.

Figure 12:
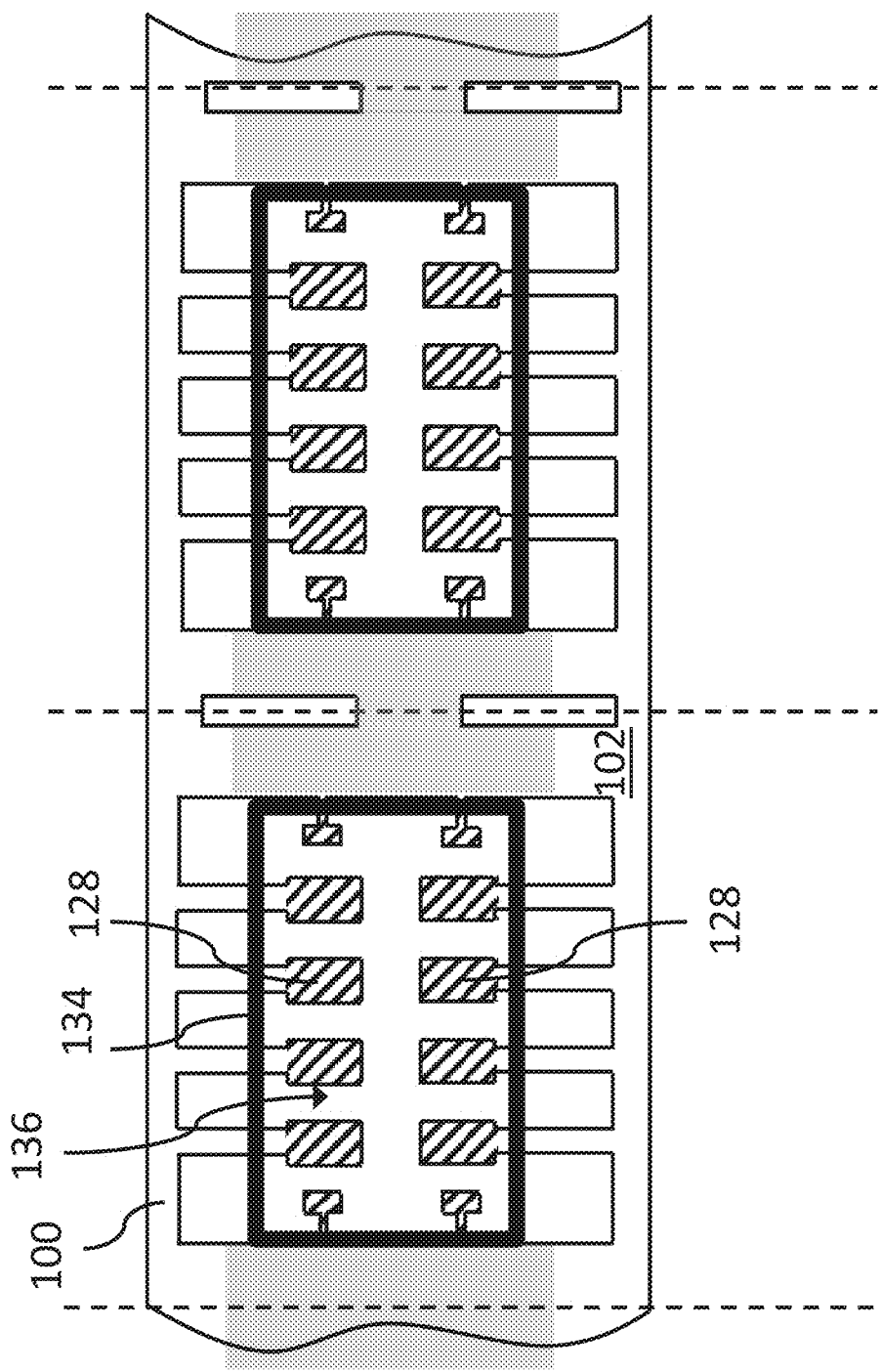
FIG. 12 illustrates a top side of a lead frame strip with a molded package outline formed on the lead frame strip and with a wire bondable layer being formed on the lead frame strip within the molded package outline, according to an embodiment.

Referring to FIG. 12, a cavity package outline 134 has been adhered to the lead frame strip 100. The cavity package outline 134 may be a pre-molded structure that is adhered to the lead frame strip 100 using an epoxy, for example. Alternatively, the cavity package outline 134 can be molded directly on the lead frame strip 100. The cavity package outline 134 is formed on the first portions of the leads 112 such that the central opening 130 is enclosed by a cavity 136 formed by outer sidewalls of the encapsulant material. That is, the outer sidewalls of the cavity package outline 134 enclose and surround the central opening 130. The outer sidewalls of the cavity package outline 134 may be formed on the elevated portions 132 of the leads 112. The adhesion promoter plating material 120 is provided at an interface between the lead frame and the electrically insulating encapsulant material.

The first unit lead frame 106 may be processed after molding the cavity package outline 134 so as to prevent the adhesion promoter plating material 120 from interfering with electrical connections between the first unit lead frame 106 and the devices (e.g., sensor elements) assembled within the cavity 136. For example, the lead frame strip 100 may be chemically treated before or after the selective plating process in a similar manner as described with reference to FIG. 5. However, these steps may be omitted. Because the electrically insulating encapsulant is formed on the lead frame strip 100 during the processing of the lead frame strip 100, the lead frame strip 100 can processed afterwards to eliminate the potentially detrimental impacts of the adhesion promoter plating material 120 on the leads 112.

According to an embodiment, after the cavity package outline 134 has been molded on the lead frame strip 100, the first unit lead frame 106 is plated with a wire bondable layer 128. The wire bondable layer 128 may be a layer of Silver (Ag), and may be formed according to the same techniques previously described with reference to FIG. 6. Therefore, any of the adhesion promoter plating material 120 on the leads 112 will not interfere with the electrical connections between the first unit lead frame 106 and the devices assembled within the cavity 136.

FIGS. 1-12 illustrate two possible embodiments of the first unit lead frame 106. However, the configuration of the first unit lead frame 106 may vary depending upon the desired configuration of the finalized package design. For example, the number and dimensions of the leads 112 and the size of the die paddle 110 may vary. The first unit lead frame 106 may be formed along a single plane or may be formed along more than one plane. For example, the first unit lead frame 106 may be vertically offset from peripheral ring 114. Furthermore, the leads 112 may have one or more bends or otherwise include a non-planar geometry. In any case, the selective plating of the adhesion promoter plating material process and the wire bond site processing techniques described herein are applicable to any of these constructions.

The single pass process offers numerous advantages over conventional techniques that require two pass processing (e.g., a non-selective adhesion promoter step followed by a selective etching of the adhesion promoter). One major advantage is a reduction in cost. This cost reduction is at least partially attributable to the elimination of at least one mask (i.e., the mask required for the selective etching of the adhesion promoter). Furthermore, frame alignment and handling issues associated with the conventional techniques are mitigated, due to the simplification of the process. Thus, yield can be improved.

Another advantage of the single pass process in comparison to conventional techniques is that a thickness reduction of the conductive lead frame material is not required. Conventional processes require the adhesion promoter to be over etched to remove the material that is beneath the adhesion promoter. This is required to ensure that the adhesion promoter is completely removed from the wire bondable layers. This thickness reduction of the conductive lead frame material may lead to a number of detrimental effects. For example, mold flashing may occur, and package singulation may be more difficult, due to the non-planar nature of the lead frame. The thickness reduction is not necessary using the techniques described herein because the adhesion promoter is only applied in the regions in which it is required.

Another advantage of the direct selective adhesion promoter plating process described herein is an improvement to the shelf life of the direct selective adhesion promoter plating material. According to conventional techniques, the package molding process should be carried out within two weeks of the adhesion promoter plating process. According to the direct selective adhesion promoter plating process described herein, the lead frame can be molded as long as 12 months after the application of the adhesion promoter plating material. Thus, the direct selective adhesion promoter plating process described herein offers flexibility wire regard to pre-fabrication, shipment and delivery.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    a die paddle;
    a plurality of electrically conductive leads extending away from the die paddle; and
    an adhesion promoter plating material selectively formed on the leads such that:
    outer portions of the leads are covered by the adhesion promoter plating material; and
    interior portions of the leads that are disposed between the die paddle and the respective outer portions of each lead are substantially devoid of the adhesion promoter plating material,
    wherein the semiconductor device comprises either one of:
        a wire bondable material formed on the interior portions of the leads and on the die paddle; or
        a corrosion resistance coating formed on the die paddle and on the leads with the adhesion promoter plating material formed on top of the corrosion resistance coating, the corrosion resistance coating comprising a different material as the adhesion promoter plating material.

2. The semiconductor device of claim 1, wherein the interior portions of the leads that are that substantially devoid of the adhesion promoter plating material encompass complete sections of the leads extending from the respective outer portions of the leads to respective interior ends of each lead, and wherein the interior ends of each lead face the die paddle.

3. The semiconductor device of claim 1, further comprising:
    a semiconductor die mounted on the die paddle; and
    an electrically conductive bond wire directly attached to the interior portion of one of the leads,
    wherein the electrically conductive bond wire forms an electrical connection between the semiconductor die and the one of the leads.

4. The semiconductor device of claim 3, further comprising an electrically insulating encapsulant material that encapsulates the semiconductor die, the leads, and the bond wire, wherein outer sidewalls of the encapsulant material form a package outline that surrounds the die paddle, and wherein the encapsulant material interfaces with the adhesion promoter plating material at the outer portions of the leads.

5. The semiconductor device of claim 3, wherein the leads comprise a conductive metal, and wherein the bond wire is directly attached to an exposed surface of the conductive metal in the interior portion of one of the leads.

6. The semiconductor device of claim 3, wherein the semiconductor device comprises the wire bondable material formed on the interior portions of the leads and on the die paddle, wherein the bond wire is directly attached to the wire bondable material in the interior portion of one of the leads, and wherein the adhesion promoter plating material on the outer portions of the leads is exposed from the wire bondable material.

7. The semiconductor device of claim 6, wherein the wire bondable material comprises any one or more of: Silver (Ag), Palladium (Pd), Gold (Au), Nickel (Ni), and Copper (Cu).

8. The semiconductor device of claim 3, wherein the semiconductor device comprises the corrosion resistance coating formed on the die paddle and on the leads with the adhesion promoter plating material formed on top of the corrosion resistance coating.

9. The semiconductor device of claim 1, further comprising a unit lead frame, wherein the unit lead frame comprises a peripheral ring that surrounds the die paddle, and wherein each of the leads and the die paddle are attached to the peripheral ring.

10. The semiconductor device of claim 1, wherein the interior portions of the leads that are that substantially devoid of the adhesion promoter plating material are disposed within the peripheral ring, and wherein the outer portions of the leads are covered by the adhesion promoter plating material extend to the peripheral ring.

11. A semiconductor device, comprising:
a plurality of leads extending away from a central opening such that interior ends of each lead face the opening;
an adhesion promoter plating material formed on each one of the leads; and
wire bondable material selectively formed on the leads such that the adhesion promoter plating material is covered by the wire bondable material on interior portions of the leads and such that the adhesion promoter plating material is exposed from the wire bondable material on outer portions of the leads, and
wherein the interior portions of the leads are disposed between the outer portions and the interior ends.

12. The semiconductor device of claim 11, wherein the interior portions of the leads that are covered by the wire bondable material encompass complete sections of the leads extending from the outer portions of the leads to the interior ends of the leads.

13. The semiconductor device of claim 11, wherein the plurality of leads surround the opening such that at least two of the leads extend away from one another in opposite directions, and wherein the central opening completely occupies the space between the two of the leads that extend away from one another in opposite directions.

14. The semiconductor device of claim 11, wherein at least one of the leads is vertically bent with an elevated portion and a lowered portion of the leads that is vertically offset from the elevated portion, wherein the outer portions of the leads with the exposed adhesion promoter plating material comprise at least a part of the elevated portion, and wherein the interior portions of the leads that are covered by the wire bondable material comprise at least a part of the lowered portion.

15. The semiconductor device of claim 11, further comprising an electrically insulating encapsulant material formed over a package outline area that surrounds the central opening such that outer sidewalls of the encapsulant material directly interface with the adhesion promoter plating material on the outer portions of the leads.

16. The semiconductor device of claim 15, wherein the electrically insulating encapsulant material is formed such that the interior portions of the leads are contained within an open cavity formed by the outer sidewalls of the encapsulant material.

17. The semiconductor device of claim 16, further comprising a sensor device contained within the open cavity and electrically connected to the interior portions of the leads.

18. The semiconductor device of claim 11, wherein the adhesion promoter plating material comprises at least one of: ZnMo and ZnV.

19. The semiconductor device of 11, wherein the wire bondable material comprises any one or more of: Silver (Ag), Palladium (Pd), Gold (Au), Nickel (Ni), and Copper (Cu).

20. The semiconductor device of claim 11, further comprising a unit lead frame, wherein the unit lead frame comprises a peripheral ring that surrounds the opening, wherein each of the leads are attached to the peripheral ring, and wherein the outer portions of the leads with the exposed adhesion promoter plating material are disposed between the interior portions and the peripheral ring.

* * * * *